United States Patent
Cheng

(10) Patent No.: US 11,605,443 B2
(45) Date of Patent: Mar. 14, 2023

(54) TEST METHOD AND TEST APPARATUS FOR SEMICONDUCTOR DEVICE

(71) Applicant: CHANGXIN MEMORY TECHNOLOGIES, INC., Hefei (CN)

(72) Inventor: Yu-Ting Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,206

(22) Filed: Jan. 18, 2022

(65) Prior Publication Data

US 2023/0009303 A1    Jan. 12, 2023

Related U.S. Application Data

(63) Continuation of application No. PCT/CN2021/114124, filed on Aug. 23, 2021.

(30) Foreign Application Priority Data

Jul. 8, 2021    (CN) .......................... 202110773197.2

(51) Int. Cl.
G11C 29/00    (2006.01)
G11C 29/50    (2006.01)

(52) U.S. Cl.
CPC .............................. G11C 29/50016 (2013.01)

(58) Field of Classification Search
CPC ........ G11C 29/50016; G11C 29/50012; G11C 29/50; G11C 29/22; G11C 29/04;

(Continued)

(56) References Cited

U.S. PATENT DOCUMENTS 6,272,588 B1 * 8/2001 Johnston .......... G11C 29/50012
365/201
7,450,458 B2 * 11/2008 Mori ...................... G11C 29/50
365/201

(Continued)

FOREIGN PATENT DOCUMENTS

| CN | 101908382 A | 12/2010 |
| CN | 103811079 B | 10/2018 |
| CN | 112037844 A | 12/2020 |

OTHER PUBLICATIONS

International Search Report and English Translation cited in PCT/CN2021/114124 dated Apr. 6, 2022, 15 pages.

*Primary Examiner* — Christine T. Tu
(74) *Attorney, Agent, or Firm* — Cooper Legal Group, LLC

(57) ABSTRACT

The present disclosure provides a test method and a test apparatus for a semiconductor device. The test method includes: forming a plurality of test values based on a first retention time range and a first step size, and sequentially testing a plurality of memory cells in the semiconductor device based on the plurality of test values in ascending order; determining, during tests corresponding to each test value, a memory cell whose retention time is less than the test value, and recording a position and corresponding test value of the memory cell whose retention time is less than the test value, to form first test data; a similar method is applied to form second test data; and determining, based on the first test data and the second test data, positions and corresponding test values of memory cells whose retention times fail to pass the tests.

11 Claims, 3 Drawing Sheets

(58) Field of Classification Search
CPC ......... G11C 29/08; G11C 29/10; G11C 29/12; G11C 29/1206
See application file for complete search history.

(56) References Cited

U.S. PATENT DOCUMENTS

| | | |
|---|---|---|
| 9,099,203 B2 | 8/2015 | Kim et al. |
| 2003/0156453 A1 | 8/2003 | Pochmuller |
| 2006/0203590 A1 | 9/2006 | Mori et al. |
| 2015/0279485 A1* | 10/2015 | Weksler ................. G11C 29/44 |
| | | 714/720 |

* cited by examiner

TEST METHOD AND TEST APPARATUS FOR SEMICONDUCTOR DEVICE

CROSS-REFERENCE TO RELATED APPLICATIONS

The present application is a continuation application of International Patent Application No. PCT/CN2021/114124, titled "TEST METHOD AND TEST APPARATUS FOR SEMICONDUCTOR DEVICE" and filed on Aug. 23, 2021, which claims the priority to Chinese Patent Application No. 202110773197.2, titled "TEST METHOD AND TEST APPARATUS FOR SEMICONDUCTOR DEVICE" and filed on Jul. 8, 2021. The entire contents of International Patent Application No. PCT/CN2021/114124 and Chinese Patent Application No. 202110773197.2 are incorporated herein by reference.

TECHNICAL FIELD

The present disclosure relates to the technical field of semiconductors, and specifically, to a test method and a test apparatus for a semiconductor device.

BACKGROUND

A dynamic random access memory (DRAM) includes a plurality of memory cells for storing data, and each memory cell may include a transistor and a capacitor. The transistor is used as a control gate through which data flows into or flows out of the memory cell, and the capacitor is used to store data in the form of an electrical charge. However, an initial charge stored in the capacitor of each memory cell may gradually disappear due to current leakage in the typical PN junction of the MOS transistor, resulting in the loss of data. Such a memory cell is referred to as a variable retention time (VRT) memory cell.

In general, storage devices have different process variables and different characteristics during the package process. For example, during the package process, some storage regions of a storage device or a memory may be exposed to high temperatures, while others may be exposed to low temperatures. Such variables have a great impact on the possibility of the VRT error in the storage devices, and the VRT errors may occur at different ratios in the storage devices.

Therefore, it is necessary to accurately determine VRT memory cells in the storage device.

It should be noted that information disclosed in the above background section is used merely for a better understanding of the background of the present disclosure, and therefore may include information that does not constitute the prior art known to those of ordinary skill in the art.

SUMMARY

According to a first aspect of the present disclosure, a test method for a semiconductor device is provided. The test method includes:

presetting a first retention time range and a first step size;

forming a plurality of test values based on the first retention time range and the first step size, and sequentially testing a plurality of memory cells in the semiconductor device based on the plurality of test values in ascending order; determining, during tests corresponding to each test value, a memory cell whose retention time is less than the test value, and recording a position and corresponding test value of the memory cell whose retention time is less than the test value, to form first test data;

presetting a second retention time range and a second step size;

forming a plurality of test values based on the second retention time range and the second step size, and sequentially testing the plurality of memory cells in the semiconductor device based on the plurality of test values in descending order; determining, during tests corresponding to each test value, a memory cell whose retention time is less than the test value, and recording a position and corresponding test value of the memory cell whose retention time is less than the test value, to form second test data; and determining, based on the first test data and the second test data, positions and corresponding test values of memory cells whose retention times fail to pass the tests.

According to another aspect of the present disclosure, a test apparatus for a semiconductor device is provided. The test apparatus includes:

one or more processors; and a storage apparatus, configured to store one or more programs, wherein the one or more programs, when executed by the one or more processors, cause the one or more processors to execute operations of:

presetting a first retention time range and a first step size, and presetting a second retention time range and a second step size;

forming a plurality of test values based on the first retention time range and the first step size, and sequentially testing a plurality of memory cells in the semiconductor device based on the plurality of test values in ascending order; determining, during tests corresponding to each test value, a memory cell whose retention time is less than the test value, and recording a position and corresponding test value of the memory cell whose retention time is less than the test value, to form first test data;

forming a plurality of test values based on the second retention time range and the second step size, and sequentially testing the plurality of memory cells in the semiconductor device based on the plurality of test values in descending order; determining, during tests corresponding to each test value, a memory cell whose retention time is less than the test value, and recording a position and corresponding test value of the memory cell whose retention time is less than the test value, to form second test data; and determining, based on the first test data and the second test data, positions and corresponding test values of memory cells whose retention times fail to pass the tests.

According to a third aspect of the present disclosure, a computer-readable storage medium is provided. The computer-readable storage medium has computer programs stored thereon, the programs, when executed by a processor, implement any test method for a semiconductor device described above.

BRIEF DESCRIPTION OF THE DRAWINGS

The accompanying drawings, which are incorporated into and constitute a part of the description, illustrate the embodiments of the present disclosure and together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
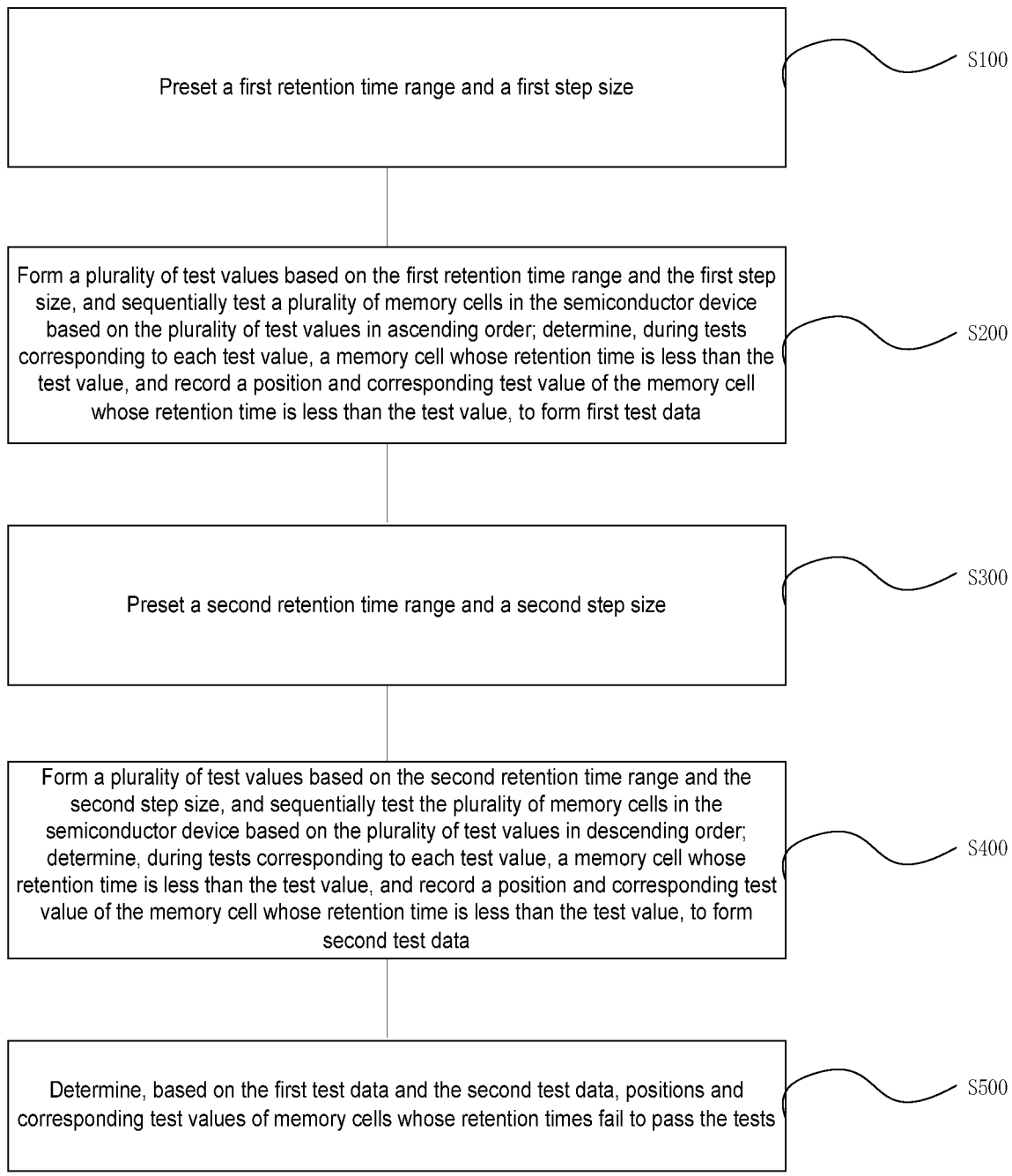
FIG. 1 is a flowchart of a test method for a semiconductor device according to an embodiment of the present disclosure.

Exemplary implementations are described below more comprehensively with reference to the accompanying drawings. However, the exemplary implementations can be implemented in various forms and should not be construed as being limited to examples described herein. On the contrary, these implementations are provided such that the present disclosure is more comprehensive and complete, and fully conveys the concept of the exemplary implementations to those skilled in the art.

Moreover, the described features, structures, or characteristics may be incorporated into one or more implementations in any suitable manner. In the following description, many specific details are provided to give a full understanding of the embodiments of the present disclosure. However, those skilled in the art will be aware that the technical solutions of the present disclosure may be practiced with one or more of the specific details omitted, or other methods, components, apparatuses, steps, and the like may be used. In other instances, well-known methods, apparatuses, implementations, or operations are not shown or described in detail to avoid obscuring aspects of the present disclosure.

Some of the block diagrams shown in the accompanying drawings are functional entities, and do not necessarily correspond to physically independent entities. That is, these functional entities may be implemented in the form of software, or implemented in one or more hardware modules or integrated circuits, or implemented in different networks and/or processor apparatuses and/or microcontroller apparatuses.

The flowcharts shown in the accompanying drawings are merely examples, and neither have to include all the content and operations/steps, nor have to be performed in the order described. For example, some operations/steps may further be decomposed, while some operations/steps may be combined or partially combined, such that an actual execution order may change with an actual situation.

The inventors have found that currently, there are three types of test retention times, and main methods for screening out memory cells with a short retention time are as follows:

First, whether a retention time of a memory cell passes a specific retention time is determined. For example, if the specific retention time is 64 ms, the retention time passes if it is greater than 64 ms, or does not pass if it is less than 64 ms. The shortcomings of this test method are: The test results are different during later tests, the correlation is poor, and the test results are not accurate. Because the VRT phenomenon itself is changing, accurate results cannot be obtained through one test.

Second, whether a retention time of a memory cell passes a specific retention time is determined for many times. It is considered that the memory cell does not pass the specific value if it fails to pass the specific value once. This test method is time consuming, and the useful information that can be obtained is very small.

Third, tests are performed in ascending order or descending order of the retention times. For example, whether a retention time passes 16 ms, 24 ms, 32 ms, and 40 ms is sequentially determined. It is considered that the retention time fails to pass when it stays at a retention time. For example, if it passes 24 ms but fails 32 ms, it is considered that the retention time passed by this memory cell is 24 ms. This method is time consuming, and a minimum retention time cannot be determined due to the presence of test noises and the VRT phenomenon.

In addition, the prior art has the following disadvantage: It is difficult to acquire position information of the failure memory cell. Different memory cells have different amounts of test data, for example, in the methods 2 and 3, a lot of data is tested or obtained data about the retention time changes (i.e., is inaccurate). Consequently, position information of the failure memory cell cannot be acquired accurately.

Due to the presence of VRT, the test noise increases and high requirements are imposed on the temperature. Therefore, how to accurately test and screen out the failure memory cells is critical. In view of the foregoing technical problems, an embodiment of the present disclosure first provides a test method for a semiconductor device. As shown in FIG. 1, the test method includes:

Step S100: Preset a first retention time range and a first step size.

Step S200: Form a plurality of test values based on the first retention time range and the first step size, and sequentially test a plurality of memory cells in the semiconductor device based on the plurality of test values in ascending order; determine, during tests corresponding to each test value, a memory cell whose retention time is less than the test value, and record a position and corresponding test value of the memory cell whose retention time is less than the test value, to form first test data.

Step S300: Preset a second retention time range and a second step size.

Step S400: Form a plurality of test values based on the second retention time range and the second step size, and sequentially test the plurality of memory cells in the semiconductor device based on the plurality of test values in descending order; determine, during tests corresponding to each test value, a memory cell whose retention time is less than the test value, and record a position and corresponding test value of the memory cell whose retention time is less than the test value, to form second test data.

Step S500: Determine, based on the first test data and the second test data, positions and corresponding test values of memory cells whose retention times fail to pass the tests.

In the test method for a semiconductor device provided in the present disclosure, a plurality of test values are formed based on a first retention time range and a first step size, and a plurality of memory cells in the semiconductor device are sequentially tested based on the plurality of test values in ascending order; during tests corresponding to each test value, a memory cell whose retention time is less than the test value is determined, and a position and corresponding test value of the memory cell whose retention time is less than the test value are recorded, to form first test data; a plurality of test values are formed based on a second retention time range and a second step size, and the plurality of memory cells in the semiconductor device are sequentially tested based on the plurality of test values in descending order; during tests corresponding to each test value, a memory cell whose retention time is less than the test value is determined, and a position and corresponding test value of the memory cell whose retention time is less than the test value is recorded, to form second test data; and positions and corresponding test values of memory cells whose retention times fail to pass the tests are determined based on the first test data and the second test data. In this way, performing tests in ascending order or descending order of the test values is integrated with VRT cycles, the minimum retention time of the memory cell can be effectively and accurately tested, and the position information of the failure memory cells is effectively recorded without damaging the test memory; the efficiency and accuracy of testing the retention times are improved; and only the most useful position information is stored, such that the memory usage may be reduced to the greatest extent. The method can be used for wafer test and aging test stages (post-packaged RDBI aging test).

The steps in the test method for a semiconductor device provided in the present disclosure are described below in detail.

In step S100, the first retention time range and the first step size are preset.

Specifically, the retention time of the memory cell is affected by the temperature, the manufacturing process, the test method, or other unknown causes. Because the test temperature range is large and different test temperatures lead to different retention times, and the test machine itself has restrictions on the number of tests, a range and step size are first roughly estimated.

The machine has restrictions on the number of tests, for example, 32 test values are limited for the aging test, and 64 test values are limited for the wafer test. Fewer test values lead to inaccurate retention time, while too many test values exceed the number of tests limited by the machine. Therefore, through optimization, the retention time range and the step size may be close to the number of tests limited by the machine, that is, the test accuracy is relatively high, but also can cover the entire retention time range.

Accordingly, first, a retention time range and a step size may be roughly estimated, and then tests are performed at a plurality of ambient temperatures. The plurality of memory cells in the semiconductor device that use the retention time and step size are tested based on the roughly estimated retention time range and step size, to obtain test data. The roughly estimated retention time range and step size are optimized based on the test data, to obtain the optimized preset first retention time range and first step size.

In step S200, the plurality of test values are formed based on the first retention time range and the first step size, and the plurality of memory cells in the semiconductor device are sequentially tested based on the plurality of test values in ascending order; during the tests corresponding to each test value, the memory cell whose retention time is less than the test value is determined, and the position and corresponding test value of the memory cell whose retention time is less than the test value are recorded, to form the first test data.

Specifically, the plurality of test values are formed based on the first retention time range and the first step size; then each test value is selected in ascending order to test the plurality of memory cells in the semiconductor device.

During the tests corresponding to each test value, whether the retention time of each of the plurality of memory cells in the semiconductor device is greater than or equal to the test value is determined.

If the retention time of the memory cell is greater than or equal to the test value, whether the test value is less than a maximum value of the first retention time range is determined.

If the retention time of the memory cell is less than the test value, the test value that the memory cell fails to pass and position information of the memory cell are output.

If the test value is less than the maximum value of the first retention time range, a next test value is selected in ascending order of the test values, and whether retention times of the plurality of memory cells in the semiconductor device pass the test value is tested based on the selected next test value.

The first test data is formed based on the corresponding test values and position information of the memory cells output in the tests corresponding to all the test values, that is, the corresponding test values and position information of the memory cells that fail to pass the test values are recorded. Only the memory cells that fail to pass the test values are recorded in the first test data. Only the most useful position information is stored, such that the memory usage is reduced to the greatest extent.

In step S300, the second retention time range and the second step size are preset.

Specifically, first, a retention time range and a step size may be roughly estimated, and then tests are performed at a plurality of ambient temperatures. The plurality of memory cells in the semiconductor device that use the retention time and step size are tested based on the roughly estimated retention time range and step size, to obtain test data. The roughly estimated retention time range and step size are optimized based on the test data, to obtain the optimized preset second retention time range and second step size.

The first retention time range may be the same as the second retention time range, and the first step size may be the same as the second step size. That is, the first retention time range and the first step size may be directly used as the second retention time range and the second step size.

In step S400, the plurality of test values are formed based on the second retention time range and the second step size, and the plurality of memory cells in the semiconductor device are sequentially tested based on the plurality of test values in descending order; during the tests corresponding to each test value, the memory cell whose retention time is less than the test value is determined, and the position and corresponding test value of the memory cell whose retention time is less than the test value are recorded, to form the second test data.

Specifically, the plurality of test values are formed based on the second retention time range and the second step size; then each test value is selected in descending order of the plurality of test values to test the plurality of memory cells in the semiconductor device.

During the tests corresponding to each test value, whether the retention time of each of the plurality of memory cells in the semiconductor device is greater than or equal to the test value is determined.

If the retention time of the memory cell is greater than or equal to the test value, whether the test value is less than or equal to a minimum value of the second retention time range is determined.

If the retention time of the memory cell is less than the test value, the test value that the memory cell fails to pass and position information of the memory cell are output.

If the test value is greater than the minimum value of the second retention time range, a next test value is selected in descending order of the test values, and whether retention times of the plurality of memory cells in the semiconductor device pass the test value is tested based on the selected next test value.

If the test value is less than or equal to the minimum value of the second retention time range, the test may be ended.

The second test data is formed based on the corresponding test values and position information of the memory cells output in the tests corresponding to all the test values, that is, the corresponding test values and position information of the memory cells that fail to pass the test values are recorded. Only the memory cells that fail to pass the test values are recorded in the second test data. Only the most useful position information is stored, such that the memory usage is reduced to the greatest extent.

Figure 2:
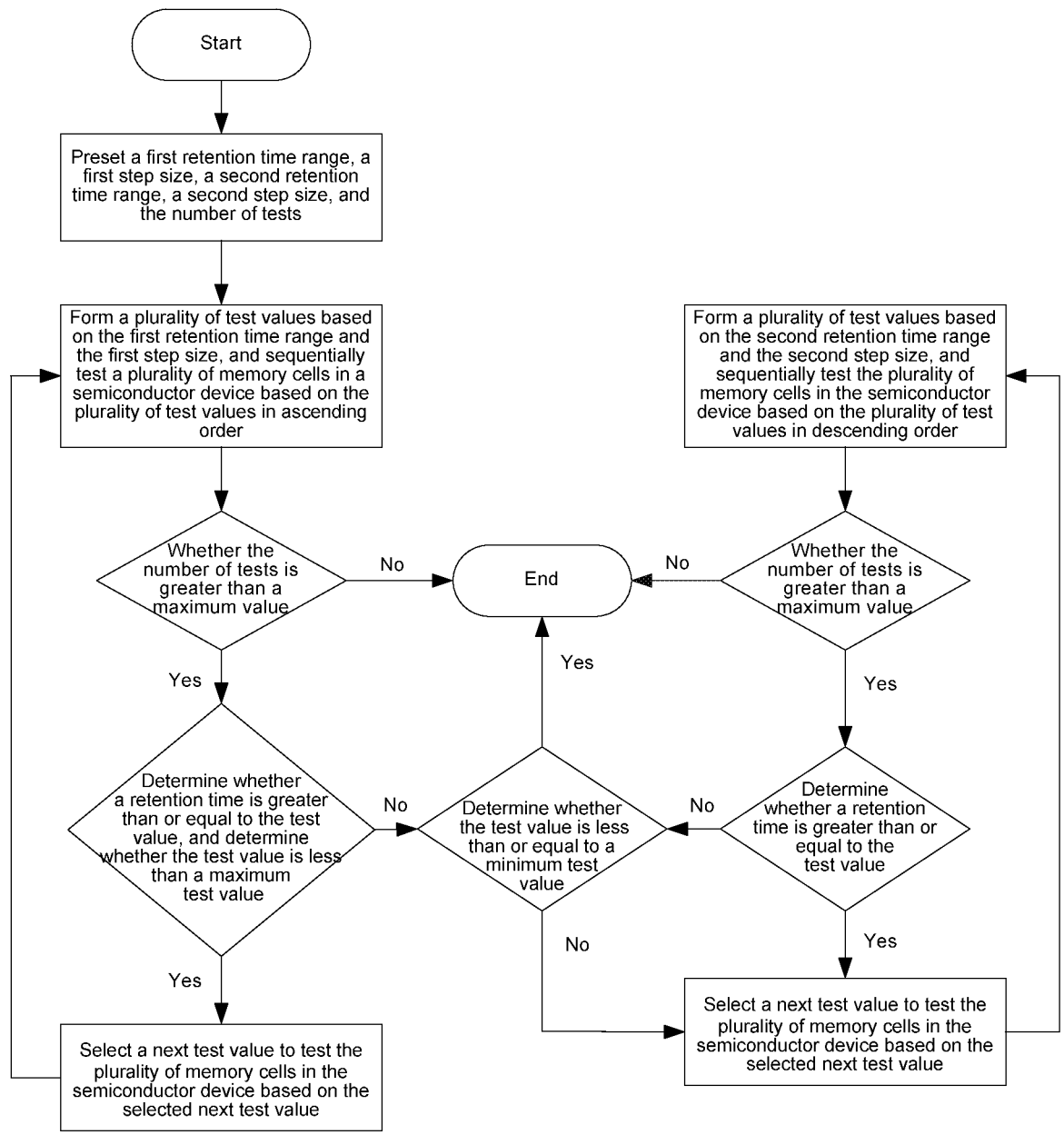
FIG. 2 is a flowchart of a test method for a semiconductor device according to another embodiment of the present disclosure.

In an embodiment of the present disclosure, as shown in FIG. 2, step S400 may be performed after the test process in step S200 is completed, to be specific, the plurality of memory cells in the semiconductor device are first sequentially tested in ascending order of the plurality of test values, and then are sequentially tested in descending order of the plurality of test values. This adds an interaction verification process.

Specifically, if the test value is greater than or equal to the maximum value of the first retention time range, whether the test value is less than or equal to the minimum value of the second retention time range is determined.

If the test value is greater than the minimum value of the second retention time range, step S400 is performed, to be specific, each test value is selected in descending order of the plurality of test values to test the plurality of memory cells in the semiconductor device.

In another embodiment of the present disclosure, step S200 may be performed after the test process in step S400 is completed, to be specific, the plurality of memory cells in the semiconductor device are first sequentially tested in descending order of the plurality of test values, and then are sequentially tested in ascending order of the plurality of test values. This adds an interaction verification process.

Specifically, if the test value is less than or equal to the minimum value of the second retention time range, whether the test value is greater than or equal to the maximum value of the first retention time range is determined.

If the test value is less than the maximum value of the first retention time range, step S200 is performed, to be specific, each test value is selected in ascending order of the plurality of test values to test the plurality of memory cells in the semiconductor device.

In step S500, positions and corresponding test values of memory cells whose retention times fail to pass the tests are determined based on the first test data and the second test data.

Specifically, the position and corresponding test value of the memory cell that fails to pass the retention time may be determined based on the first test data, and the position and corresponding test value of the memory cell that fails to pass the retention time may be determined based on the second test data; and a union of the memory cells that are determined based on the first test data and the second test data and whose retention times fail to pass the tests is calculated and used as a test result.

In another embodiment of the present disclosure, the test method further includes:

determining the number of tests, where each time a test is performed based on a test value, one test is recorded;

determining whether the number of tests reaches a maximum value before sequentially testing the plurality of memory cells in the semiconductor device based on the plurality of test values in ascending order and sequentially testing the plurality of memory cells in the semiconductor device based on the plurality of test values in descending order; and determining whether the number of tests reaches the number of tests limited by the machine; and if no, continuing the test; or if yes, ending the test.

The first step size and the second step size are preset based on the number of tests. Fewer test values lead to inaccurate retention time, while too many test values exceed the number of tests limited by the machine. Therefore, through optimization based on the number of tests limited by the machine, the first step size and the second step size may be close to the number of tests limited by the machine, that is, the test accuracy is relatively high, but also can cover the entire retention time range.

An apparatus embodiment of the present disclosure is described below, which can be used to perform the test method for a semiconductor device of the present disclosure.

Figure 3:
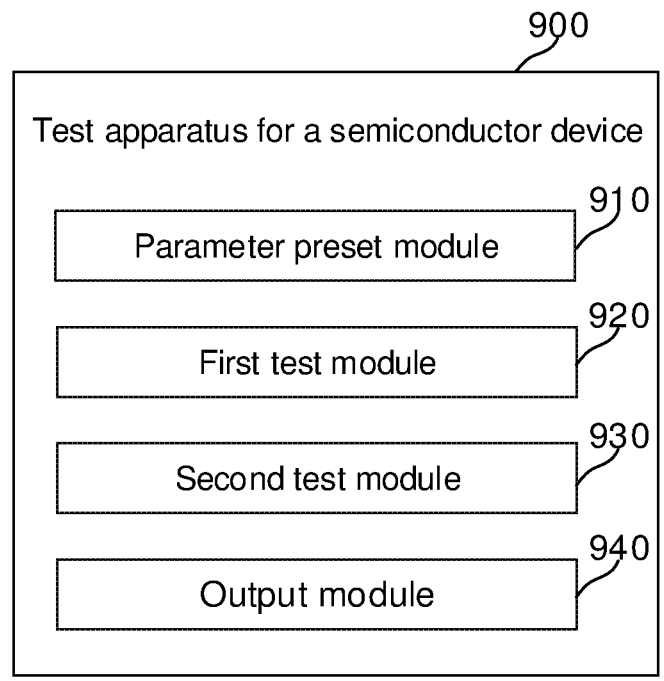
FIG. 3 is a schematic diagram of a test apparatus for a semiconductor device according to an embodiment of the present disclosure.

An embodiment of the present disclosure further provides a test apparatus for a semiconductor device. As shown in FIG. 3, the test apparatus 900 includes:

a parameter preset module 910, configured to: preset a first retention time range and a first step size, and preset a second retention time range and a second step size;

a first test module 920, connected to the parameter preset module 910, where the first test module 920 is configured to: form a plurality of test values based on the first retention time range and the first step size, and sequentially test a plurality of memory cells in the semiconductor device based on the plurality of test values in ascending order; determine, during tests corresponding to each test value, a memory cell whose retention time is less than the test value, and record a position and corresponding test value of the memory cell whose retention time is less than the test value, to form first test data;

a second test module 930, connected to the parameter preset module 910 and the first test module 920, where the second test module 930 is configured to: form a plurality of test values based on the second retention time range and the second step size, and sequentially test the plurality of memory cells in the semiconductor device based on the plurality of test values in descending order; determine, during tests corresponding to each test value, a memory cell whose retention time is less than the test value, and record a position and corresponding test value of the memory cell whose retention time is less than the test value, to form second test data; and an output module 940, connected to the first test module 920 and the second test module 930, where the output module 940 is configured to determine, based on the first test data and the second test data, positions and corresponding test values of memory cells whose retention times fail to pass the tests.

According to the test apparatus for a semiconductor device provided in the present disclosure, the parameter preset module presets a first retention time range and a first step size, and presets a second retention time range and a second step size; the first test module forms a plurality of test values based on the first retention time range and the first step size, and sequentially tests a plurality of memory cells in the semiconductor device based on the plurality of test values in ascending order; determines, during tests corresponding to each test value, a memory cell whose retention time is less than the test value, and records a position and corresponding test value of the memory cell whose retention time is less than the test value, to form first test data; the second test module forms a plurality of test values based on the second retention time range and the second step size, and sequentially tests the plurality of memory cells in the semiconductor device based on the plurality of test values in descending order; determines, during tests corresponding to each test value, a memory cell whose retention time is less than the test value, and records a position and corresponding test value of the memory cell whose retention time is less than the test value, to form second test data; and the output module determines, based on the first test data and the second test data, positions and corresponding test values of memory cells whose retention times fail to pass the tests. In this way, performing tests in ascending order or descending order of the test values is integrated with VRT cycles, the minimum retention time of the memory cell can be effectively and accurately tested, and the position information of the failure memory cells is effectively recorded without damaging the test memory; the efficiency and accuracy of testing the retention times are improved; and only the most useful position information is stored, such that the memory usage may be reduced to the greatest extent. The method can be used for wafer test and aging test stages (post-packaged RDBI aging test).

Since the functional modules of the test apparatus for a semiconductor device in the example embodiment of the present disclosure correspond to the step sizes of the example embodiment of the test method for a semiconductor device, for the details not disclosed in the apparatus embodiment of the present disclosure, refer to the embodiment of the test method for a semiconductor device of the present disclosure.

Figure 4:
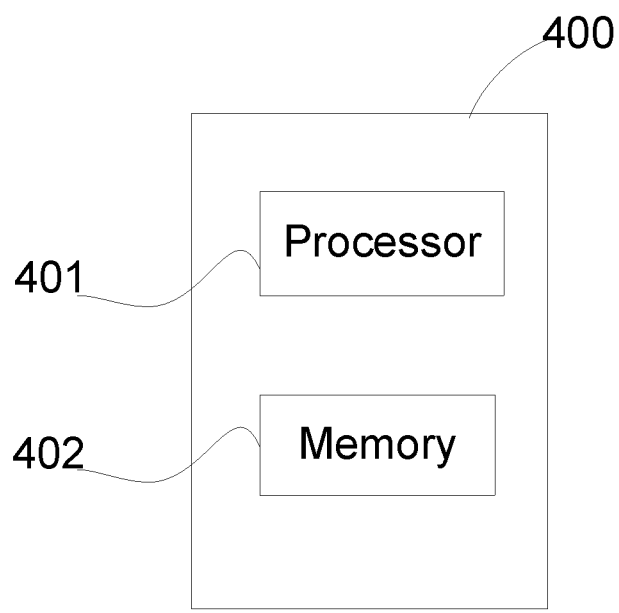
FIG. 4 is a block diagram of a test apparatus for a semiconductor device according to an embodiment of the present disclosure.

An exemplary embodiment of the present disclosure provides an apparatus for testing semiconductor devices. Referring to FIG. 4, the apparatus for testing semiconductor devices 400 may be provided as a terminal device. The apparatus for testing semiconductor devices 400 may include a processor 401, and one or more processors may be set as required. The apparatus for testing semiconductor devices 400 may further include a memory 402 configured to store an executable instruction, such as an application program, of the processor 401. One or more memories may be set as required. The memory may store one or more application programs. The processor 401 is configured to execute the instruction to perform the foregoing method.

Persons skilled in the art should understand that the embodiments of the present disclosure may be provided as a method, an apparatus (device), or a computer program product. Therefore, the present disclosure may use a form of hardware only examples, software only examples, or examples with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a RAM, a ROM, an EEPROM, a flash memory or other storage technologies, a CD-ROM, a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons of ordinary skill in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including instructions is provided. Referring to FIG. 4, for example, the non-transitory computer-readable storage medium may be the memory 402 including instructions. The foregoing instructions may be executed by the processor 401 of the apparatus for testing semiconductor devices 400 to complete the foregoing method. For example, the non-transitory computer-readable storage medium may be a ROM, a RAM, a CD-ROM, a magnetic tape, a floppy disk, an optical data storage device, or the like.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or another programmable device, thereby generating computer-implemented processing. Therefore, the instructions executed on the computer or another programmable device provide steps for implementing a function specified in one or more processes in the flowcharts and/or in one or more blocks in the block diagrams.

It should be noted that although several modules or units of the apparatus for action execution are mentioned in detail above, this division is not mandatory. In fact, according to the embodiments of the present disclosure, the features and functions of two or more modules or units described above may be embodied in one module or unit. Conversely, the features and functions of one module or unit described above may be further divided into a plurality of modules or units.

Through the foregoing description of the embodiments, persons skilled in the art may easily understand that the exemplary embodiments described herein may be implemented by software, or may be implemented by software in combination with necessary hardware. Therefore, the technical solutions according to the embodiments of the present disclosure may be implemented in a form of a software product. The software product may be stored in a non-volatile storage medium or network, and includes a plurality of instructions to cause a computing device (which may be a personal computer, a server, a touch terminal, a network device, or the like) to perform the method according to the embodiments of the present disclosure.

Those skilled in the art may easily figure out other implementations of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A test method for a semiconductor device, comprising:
presetting a first retention time range and a first step size;
forming a plurality of test values based on the first retention time range and the first step size, and sequentially testing a plurality of memory cells in the semiconductor device based on the plurality of test values in ascending order; determining, during tests corresponding to each test value, a memory cell whose retention time is less than the test value, and recording a position and corresponding test value of the memory cell whose retention time is less than the test value, to form first test data;
presetting a second retention time range and a second step size;
forming a plurality of test values based on the second retention time range and the second step size, and sequentially testing the plurality of memory cells in the semiconductor device based on the plurality of test values in descending order; determining, during tests corresponding to each test value, a memory cell whose retention time is less than the test value, and recording a position and corresponding test value of the memory cell whose retention time is less than the test value, to form second test data; and
determining, based on the first test data and the second test data, positions and corresponding test values of memory cells whose retention times fail to pass the tests.

2. The test method according to claim 1, wherein the presetting a first retention time range and a first step size comprises:
presetting a retention time, a step size and a plurality of test ambient temperatures;
testing, at each of the plurality of test ambient temperatures based on the retention time and the step size, a plurality of memory cells in the semiconductor device that use the retention time and the step size, to obtain test data; and
presetting the first retention time range and the first step size based on the test data, the retention time, and the step size.

3. The test method according to claim 1, wherein the presetting a second retention time range and a second step size comprises:
presetting a retention time, a step size and a plurality of test ambient temperatures;
testing, at each of the plurality of test ambient temperatures based on the retention time and the step size, a plurality of memory cells in the semiconductor device that use the retention time and the step size, to obtain test data; and
presetting the second retention time range and the second step size based on the test data, the retention time, and the step size.

4. The test method according to claim 1, wherein the first retention time range is the same as the second retention time range, and the first step size is the same as the second step size.

5. The test method according to claim 1, wherein the forming a plurality of test values based on the first retention time range and the first step size, and sequentially testing a plurality of memory cells in the semiconductor device based on the plurality of test values in ascending order; determining, during tests corresponding to each test value, a memory cell whose retention time is less than the test value, and recording a position and corresponding test value of the memory cell whose retention time is less than the test value, to form first test data comprises:
forming the plurality of test values based on the first retention time range and the first step size;
sequentially selecting each test value in ascending order of the plurality of test values to test the plurality of memory cells in the semiconductor device;
determining, during the tests corresponding to each test value, whether a retention time of each of the plurality of memory cells in the semiconductor device is greater than or equal to the test value;
when the retention time of each of the plurality of memory cells is greater than or equal to the test value, determining whether the test value is less than a maximum value of the first retention time range; or
when the retention time of each of the plurality of memory cells is not greater than or equal to the test value, outputting a test value and position information of the memory cell;
when the test value is less than the maximum value of the first retention time range, sequentially selecting a next test value to test the plurality of memory cells in the semiconductor device based on the selected next test value; and
forming the first test data based on test values and position information of memory cells output in tests corresponding to all the test values.

6. The test method according to claim 5, wherein the forming a plurality of test values based on the second retention time range and the second step size, and sequentially testing the plurality of memory cells in the semiconductor device based on the plurality of test values in descending order; determining, during tests corresponding to each test value, a memory cell whose retention time is less than the test value, and recording a position and corresponding test value of the memory cell whose retention time is less than the test value, to form second test data comprises:
forming the plurality of test values based on the second retention time range and the second step size;
sequentially selecting each test value in descending order of the plurality of test values to test the plurality of memory cells in the semiconductor device;

determining, during the tests corresponding to each test value, whether a retention time of each of the plurality of memory cells in the semiconductor device is greater than or equal to the test value;

when the retention time of each of the plurality of memory cells is greater than or equal to the test value, determining whether the test value is less than or equal to a minimum value of the second retention time range; or when the retention time of each of the plurality of memory cells is not greater than or equal to the test value, outputting a test value and position information of the memory cell;

when the test value is greater than the minimum value of the second retention time range, sequentially selecting a next test value to test the plurality of memory cells in the semiconductor device based on the selected next test value; and forming the second test data based on test values and position information of memory cells output in the tests corresponding to all the test values.

7. The test method according to claim 6, wherein the test method further comprises:

when the test value is greater than or equal to the maximum value of the first retention time range, determining whether the test value is less than the minimum value of the second retention time range; and when the test value is greater than the minimum value of the second retention time range, sequentially selecting each test value in descending order of the plurality of test values to test the plurality of memory cells in the semiconductor device.

8. The test method according to claim 1, wherein the test method further comprises:

determining the number of tests;

determining whether the number of tests reaches a maximum value before sequentially testing the plurality of memory cells in the semiconductor device based on the plurality of test values in ascending order and sequentially testing the plurality of memory cells in the semiconductor device based on the plurality of test values in descending order; and when the number of tests has not reached the maximum value, continuing the test; or when the number of tests reaches the maximum value, ending the test.

9. The test method according to claim 8, wherein the first step size and the second step size are preset based on the number of tests.

10. The test method according to claim 1, wherein the determining, based on the first test data and the second test data, positions and corresponding test values of memory cells whose retention times fail to pass the tests comprises:

determining, based on the first test data, a position and corresponding test value of a memory cell whose retention time fails to pass the test;

determining, based on the second test data, a position and corresponding test value of a memory cell whose retention time fails to pass the test; and calculating a union of the memory cells that are determined based on the first test data and the second test data and whose retention times fail to pass the tests, and using the union as a test result.

11. A test apparatus for a semiconductor device, comprising:

a parameter preset module, configured to: preset a first retention time range and a first step size, and preset a second retention time range and a second step size;

a first test module, connected to the parameter preset module, wherein the first test module is configured to: form a plurality of test values based on the first retention time range and the first step size, and sequentially test a plurality of memory cells in the semiconductor device based on the plurality of test values in ascending order;

determine, during tests corresponding to each test value, a memory cell whose retention time is less than the test value, and record a position and corresponding test value of the memory cell whose retention time is less than the test value, to form first test data;

a second test module, connected to the parameter preset module and the first test module, wherein the second test module is configured to: form a plurality of test values based on the second retention time range and the second step size, and sequentially test the plurality of memory cells in the semiconductor device based on the plurality of test values in descending order; determine, during tests corresponding to each test value, a memory cell whose retention time is less than the test value, and record a position and corresponding test value of the memory cell whose retention time is less than the test value, to form second test data; and an output module, connected to the first test module and the second test module, wherein the output module is configured to determine, based on the first test data and the second test data, positions and corresponding test values of memory cells whose retention times fail to pass the tests.

* * * * *